United States Patent [19]

Obata et al.

[11] Patent Number: 4,931,972

[45] Date of Patent: Jun. 5, 1990

[54] MULTIPLE-INPUT DIGITAL FILTER

[75] Inventors: Yoshimori Obata; Makoto Toko, both of Tokyo, Japan

[73] Assignee: Kabushiki Kaisha Toshiba, Kanagawa, Japan

[21] Appl. No.: 198,055

[22] Filed: May 24, 1988

[30] Foreign Application Priority Data

May 26, 1987 [JP] Japan ............................ 62-127106

[51] Int. Cl.⁵ .............................................. G06F 7/38
[52] U.S. Cl. ........................... 364/724.13; 364/724.01
[58] Field of Search ................ 364/724.01, 724.13, 364/724.06–724.09; 328/167; 377/54.70

[56] References Cited

U.S. PATENT DOCUMENTS

| | | | |
|---|---|---|---|
| 3,732,409 | 5/1973 | Fletcher et al. | 364/724.01 |
| 4,081,130 | 3/1978 | Bolgiano | 377/55 |
| 4,091,236 | 5/1978 | Chen | 328/167 |
| 4,101,964 | 7/1978 | Betts | 364/724.13 |
| 4,136,912 | 1/1979 | Hesse et al. | 364/724.01 |
| 4,216,463 | 8/1980 | Backof, Jr. et al. | 364/724.09 |
| 4,327,335 | 4/1982 | Missoat et al. | 328/167 |
| 4,442,500 | 4/1984 | Kongable et al. | 328/167 |

OTHER PUBLICATIONS

Glaser, "Multiplexing of Analog systems with Application to the W-Path Filter", Proc. of the 13th midwest symposium on circuit theory, Minneapolis, Minn.; May 7–8, 1970; III.1.1–III.1.10.

Primary Examiner—Gary V. Harkcom
Assistant Examiner—Dale M. Shaw
Attorney, Agent, or Firm—Finnegan, Henderon, Farabow, Garrett and Dunner

[57] ABSTRACT

A multiple-input digital filter capable of filtering a plurality of digital input signals with a single filtering device first latches the input signals and then sequentially selects each of the digital input signals for output to a counter circuit. The counter circuit, which is preset by the previous count value for the corresponding digital input signal, counts up or down depending on the digital input signal. When the count value reaches its maximum, a decision value signal is set for the corresponding digital input signal until the count value for that digital input signal returns to the minimum value. The count values are stored in a shift register which supplies the count value corresponding to the digital input signal as a preset value to the counter. A second shift register stores the decision values corresponding to each of the digital input signals which are then latched for simultaneous output.

7 Claims, 4 Drawing Sheets

FIG. 1. (PRIOR ART)
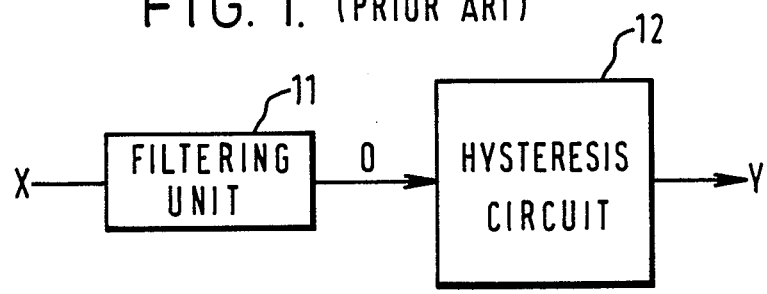
FIG. 2(a) (PRIOR ART)    X
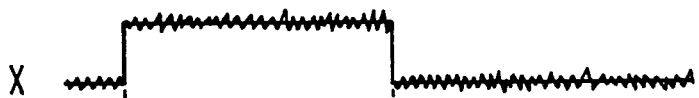
FIG. 2(b) (PRIOR ART)    0
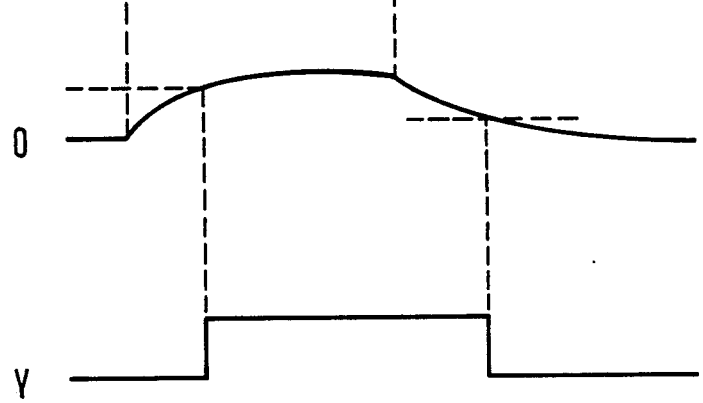
FIG. 2(c) (PRIOR ART)    Y

MULTIPLE-INPUT DIGITAL FILTER

BACKGROUND OF THE INVENTION

This invention relates to a digital filter and more particularly to a multiple-input digital filter.

Generally, when a digital signal is inputted to a digital device, it is converted to a stable digital signal by passing it through a filter for noise removal and then passing this filter output through a hysteresis circuit having two threshold values.

FIG. 1 is a block diagram showing a conventional digital filter.

In FIG. 1, a filtering unit 11 is an integrating filter using capacitance and resistance (C/R) which can cut the high frequency components of noise.

When a step signal containing noise X such as shown in FIG. 2(a), is inputted to the filtering unit 11, the filter output takes on the indistinct waveform shown in FIG. 2(b). If this filter output waveform is used in a digital circuit as it stands, the logical value becomes unstable in the region midway between the level which is recognisable as logical value "0" and the level recognisable as logical value "1", and therefore the operation of a digital circuit using these logical values becomes unstable.

If the filter output 0 is passed through a hysteresis circuit 12, it will change to the output Y taking the distinct form shown in FIG. 2(C) and the unstable region of logical values will be eliminated so that operation of the digital circuit can be stabilized. However, this digital filter can only process 1 digital input signal. Therefore, for digital inputs from multiple points, it is necessary to have the corresponding number of filters. Consequently, the number of parts required will increase and there will be problems of cost and space.

Moreover, the circuit characteristics of the hysteresis circuit 12 and CR integrating filtering unit 11 are determined by the elements used, and there is the problem that the characteristics for each input point will differ depending on the randomness of the characteristics of the element used.

SUMMARY OF THE INVENTION

It is an object of this invention to filter a plurality of digital inputs with improved reliability.

Another object of this invention is to make it possible to filter a plurality of digital inputs with a single filtering device.

Additional objects and advantages will be obvious from the description which follows, or may be learned by the practice of he invention.

The foregoing objects are achieved according to the present invention by providing a multiple-input digital filter including receiver means for receiving a plurality of digital input signals at one time and outputting one of the digital input signals in response to first control signal, counter means for conducting predetermined counting operations according to the outputted values of the digital input signals, the counting operations producing count values each corresponding to one of the digital input signals in response to a second control signal, decision circuit means for outputting a predetermined decision value signal from a time when the count value reaches a first predetermined value to a time when the count value signal reaches a second predetermined value, holding means for holding the count values and for supplying one of the count values as a preset value to the counter means for a corresponding digital input signal in response to a third control signal, output circuit means for latching each of the decision values according to corresponding digital input signals and for simultaneously outputting a plurality of the decision values in response to a fourth control signal, and timing means for generating the first, second, third, and fourth control signals.

BRIEF DESCRIPTION OF THE DRAWINGS

A more complete appreciation of the invention and many of attendant advantages thereof will be readily obtained as the same becomes better understood by reference to the following detailed description when considered in connection with the accompanying drawings, wherein:

FIG. 1 is a block diagram showing a conventional digital filter;

FIGS. 2(a), 2(b), and 2(c) are timing charts showing operations of a conventional filter;

DETAILED DESCRIPTION OF THE PREFERRED EMBODIMENTS

Figure 3:
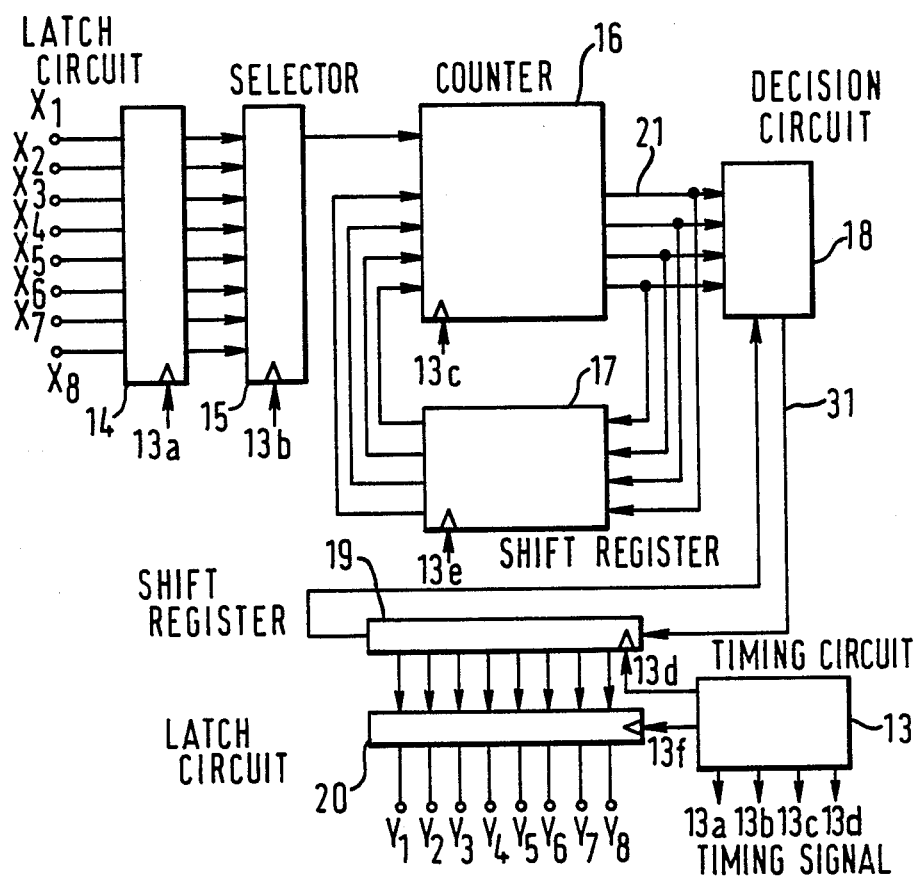
FIG. 3 is a block diagram showing an embodiment of the invention.

FIG. 3 shows an embodiment of this invention which includes a latch circuit 14, a selector 15, and a counter 16. The invention includes receiver means for receiving a plurality of digital input signals at one time and outputting one of the digital input signals in response to a first control signal. As embodied herein, the receiver means includes the latch circuit 14 and the selector 15. In FIG. 3, multiple input digital signals X1–X8 are latched by the latch circuit 14 in response to input latch signals 13a from a timing circuit 13. Then, the multiple digital signals supplied as output from the latch circuit 14 are sequentially selected one at a time in a time-sharing system by the selector 15 in response to data-selection signals 13b from the timing circuit 13.

The multiple digital signals are supplied as input to a U/D (up-down) counter 16. The invention includes counter means for conducting predetermined counting operations according to the outputted values of the digital input signals.

The U/D counter 16 generates a four-bit count value 21 as follows and receives a preset value from the last step of shift register 17 in response to count start signals 13c received from the timing circuit 13. The preset value consists of the previous count value for the selected input signal.

The U/D counter 16 counts up from the preset value when the logical value of the selected input signal is positive or counts down from the preset value when the logical value of the selected signal is negative. The current count value is supplied as input to a decision circuit 18 and a shift register 17.

The invention includes decision circuit means for outputting a predetermined decision value signal from a time when the count value reaches a first predetermined value to a time when the count value signal reaches a second predetermined value. The decision circuit 18 provides an output signal 31 which represents the logical value of the selected digital input signal. The value of output 31 is determined by the previous value of output signal and by the current count value.

Determination of the logical value of the selected input signal is carried out as follows.

Figure 4:
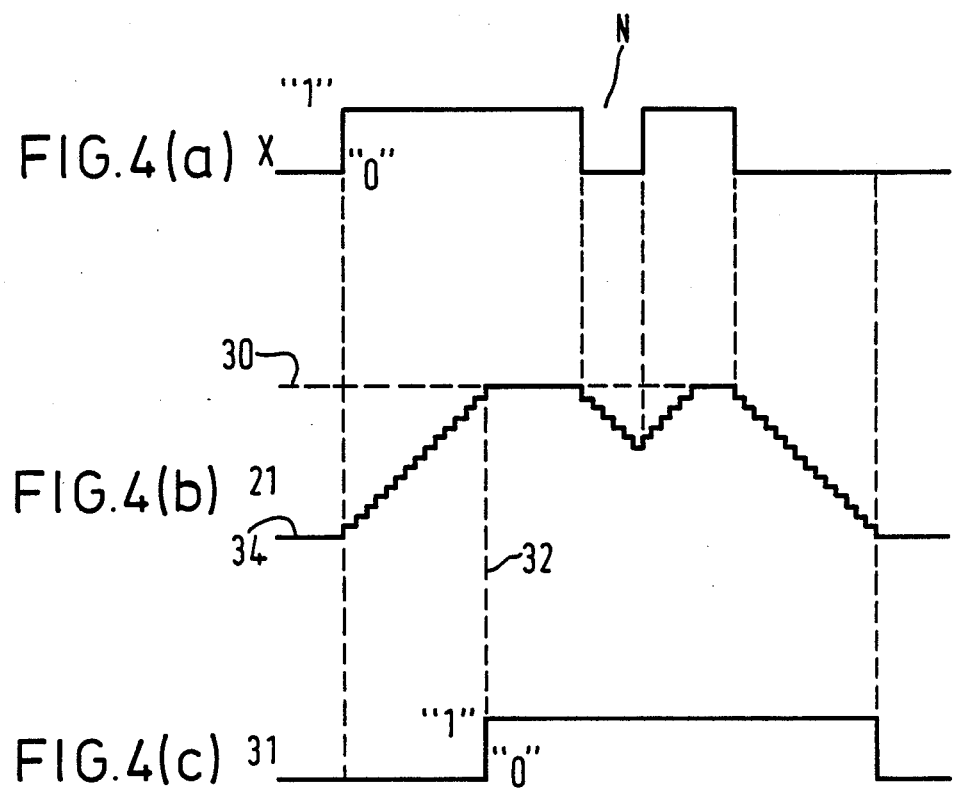
FIGS. 4(a), 4(b), and 4(c) are timing charts showing the filtering operation of the invention.

FIG. 4(a) shows a selected digital input signal including a "dropout" or noise, portion N. As shown in FIG. 4(b), when the current count value of the U/D counter 16 for a selected digital input signal reaches the count upper limit value (1111) 30 as shown at 32 in FIG. 4(b), output 31 of decision circuit 18 switches to logical value "1" as shown in FIG. 4(c). Conversely, when the current count value of U/D counter 16 reaches the count lower limit (0000) 34, output 31 of decision circuit 18 switches to logical value "0". For count values other than the count upper limit and count lower limit, the value of output 31 is maintained at the previous value.

As described above, since the noise portion N is time-integrated, the selected digital input signal including the noise portion N is transformed to a digital output signal without noise portion through the U/D counter.

The invention includes holding means for holding the count values and for supplying one of the count values as a preset value to the counter means for a corresponding digital input signal in response to a third control signal. The holding means comprises a shift register 17 which holds the current count value of the selected input signal and presets this in the U/D counter 16 as the preset count value for the next U/D count in response to output control signals 13e. In FIG. 3, the shift register 17 has four input signal points and is therefore of 4 bit×8 stage shift register construction.

The invention includes output circuit means for latching each of the decision values according to corresponding digital input signals and for simultaneously outputting a plurality of the decision values in response to a fourth control signal. The output circuit means includes a shift register 19 and a latch circuit 20.

The shift register 19 holds the current decision value of the selected input signal in response to decision control signals 13d and, besides using this as the previous decision value for the next round, it outputs the multiple decision values corresponding to each input signal via the latch circuit 20. In FIG. 3, the shift register 19 is of 1 bit×8 stage shift register construction.

The latch circuit 20 holds the outputted decision values from each stage of the shift register 19 in response to output latch signals 13f from the timing circuit 13 until the next output latch signal is inputted, and then outputs them.

Figure 5:
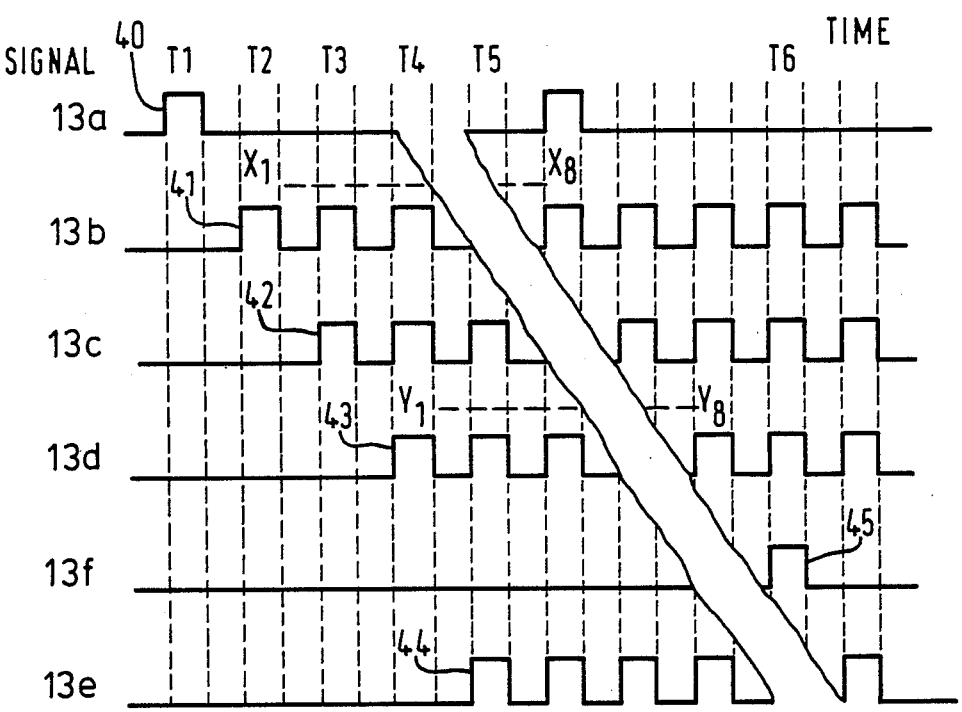
FIG. 5 is a timing chart showing relationships of timing signals generated from the timing circuit.

FIG. 5 shows relationships between the timing signals generated from the timing circuit 13. As shown in FIG. 5, the multiple input digital signals X1–X8 are latched on receipt of a signal 40 at a time T1. The multiple digital signals supplied are selected one X1 on receipt of a signal 41 at a time T2. The counter conducts predetermined counting operations on the receipt of a signal 42 at a time T3. The decision value is held by the shift register 19 on receipt of a signal 43 at a time T4. The count value is held by the shift register 17 on receipt of a signal 44 at a time T5. At a time T6, the decision values Y1–Y8 are held by the latch circuit 20 in response to a signal 45 until the next output signal 13f is inputted, and then simultaneously outputs them as well explained above.

As described above, multi-input digital signals can be filtered by this filter according to the invention.

What is claimed is:

1. A multiple-input digital filter comprising:
   receiver means for receiving a plurality of digital input signals at one time and outputting one of the digital signals at a time;
   counter means, coupled to the receiving means, for conducting predetermined counting operations according to the outputted values of the digital input signals, the counting operations producing count values each corresponding to one of the digital input signals;
   decision circuit means, coupled to the counter means, for outputting a predetermined decision value signal from a time when each count value corresponding to one of the digital input signals reaches a first predetermined value to a time when the same count value reaches a second predetermined value;
   holding means, coupled to the counter means, for holding the count values and for supplying one of the count values as a preset value to the counter means for a corresponding digital input signal; and
   output circuit means, coupled to the decision circuit means, for latching each of the decision values corresponding to the digital input signals and for simultaneously outputting a plurality of the decision values.

2. The filter according to claim 1, wherein the receiver means includes:
   latch circuit means for receiving and latching the plurality of digital input signals at one time and for supplying latched values of the digital input signals, and
   selector means, coupled to the latch circuit means, for outputting one of the latched values.

3. The filter according to claim 2, wherein the selector means comprises means for sequentially outputting one of the latched values.

4. The filter according to claim 1, wherein the holding means comprises a shift register.

5. The filter according to claim 1, further comprising:
   second holding means, coupled to the decision circuit means, for holding the decision values and for supplying one of the decision values for a corresponding count value to the decision circuit means.

6. The filter according to claim 5, wherein the output circuit means includes latch circuit means, coupled to the second holding means, for simultaneously outputting the plurality of decision values.

7. The filter according to claim 5, wherein the second holding means comprises a shift register.

* * * * *